(12) United States Patent
Eldridge

(10) Patent No.: US 6,834,663 B2
(45) Date of Patent: Dec. 28, 2004

(54) SMALL SCALE ACTUATORS AND METHODS FOR THEIR FORMATION AND USE

(75) Inventor: Jerome M. Eldridge, Los Gatos, CA (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 10/737,573

(22) Filed: Dec. 16, 2003

(65) Prior Publication Data

US 2004/0124381 A1 Jul. 1, 2004

Related U.S. Application Data

(62) Division of application No. 10/320,993, filed on Dec. 16, 2002, now Pat. No. 6,672,325, which is a division of application No. 09/644,365, filed on Aug. 23, 2000, now Pat. No. 6,561,479.

(51) Int. Cl.[7] ............................................. F16K 31/122
(52) U.S. Cl. ........................... 137/15.19; 251/11; 216/2
(58) Field of Search ............................... 251/11, 62, 89; 137/15.18, 15.19, 72, 74, 67, 341; 60/527, 528; 310/306, 307

(56) References Cited

U.S. PATENT DOCUMENTS

| | | | | |
|---|---|---|---|---|
| 5,354,419 A | * | 10/1994 | Hadimioglu | 216/2 |
| 5,585,011 A | * | 12/1996 | Saaski et al. | 216/2 |
| 5,617,632 A | * | 4/1997 | Saaski et al. | 137/15.18 |
| 5,620,931 A | * | 4/1997 | Tsang et al. | 216/2 |
| 6,023,121 A | * | 2/2000 | Dhuler et al. | 310/307 |
| 6,288,437 B1 | * | 9/2001 | Forbes et al. | 257/530 |
| 6,302,134 B1 | * | 10/2001 | Kellogg et al. | 137/74 |
| 6,435,396 B1 | * | 8/2002 | Eldridge | 228/33 |
| 6,561,208 B1 | * | 5/2003 | O'Connor et al. | 137/15.18 |
| 6,561,479 B1 | * | 5/2003 | Eldridge | 251/11 |
| 6,612,535 B1 | * | 9/2003 | Tai et al. | 251/11 |
| 6,672,325 B2 | * | 1/2004 | Eldridge | 251/11 |

* cited by examiner

Primary Examiner—David A. Scherbel
Assistant Examiner—Eric Keasel
(74) Attorney, Agent, or Firm—Perkins Coie LLP

(57) ABSTRACT

An actuator assembly and method for making and using an actuator assembly. In one embodiment, the assembly includes an actuator body having an actuator channel with a first region and a second region. An actuator is disposed in the actuator channel and is movable when in a flowable state between a first position and a second position. A heater is position proximate to the actuator channel to heat the actuator from a solid state to a flowable state. A source of gas or other propellant is positioned proximate to the actuator channel to drive the actuator from the first position to the second position. The actuator has a higher surface tension when engaged with the second region of the channel than when engaged with the first region. Accordingly, the actuator can halt upon reaching the second region of the channel due to the increased surface tension between the actuator and the second region of the channel.

21 Claims, 5 Drawing Sheets

SMALL SCALE ACTUATORS AND METHODS FOR THEIR FORMATION AND USE

CROSS-REFERENCE TO RELATED APPLICATIONS

This application is a divisional of U.S. patent application Ser. No. 10/320,993, entitled "SMALL SCALE ACTUATORS AND METHODS FOR THEIR FORMATION AND USE," filed on Dec. 16, 2002, now U.S. Pat. No. 6,672,325, issued on Jan. 6, 2004, which is a divisional of U.S. patent application Ser. No. 09/644,365, filed on Aug. 23, 2000, now U.S. Pat. No. 6,561,479, issued on May 13, 2003, both of which are incorporated herein by reference in their entireties. This application relates to copending U.S. patent application Ser. No. 10/738,827, entitled "SMALL SCALE ACTUATORS AND METHODS FOR THEIR FORMATION AND USE," filed concurrently herewith, and incorporated herein by reference in its entirety.

TECHNICAL FIELD

The present invention is directed toward small actuators for devices such as valves, and methods for forming and using such actuators.

BACKGROUND

Microvalves are miniature valves used to control fluid flows at low flow rates. Such valves and other microelectromechanical (MEMS) devices are conventionally used in several industrial and professional applications where it is important to precisely regulate the flow of small quantities of gases or liquids. For example, microvalves are used for some types of medical research (such as DNA research), medical treatments, and other types of applications that involve metering fluids at low flow rates.

Some conventional microvalves are formed directly in a semiconductor substrate (such as silicon) using techniques generally similar to those used to form integrated circuits. Such valves typically include a flexible diaphragm that opens and closes a fluid orifice when selected voltages are applied to the valve. Examples of such valves are disclosed in U.S. Pat. No. 5,810,325 to Carr, which is incorporated herein in its entirety by reference.

One drawback with some conventional diaphragm microvalves of the type described above is that the valves may fail because the diaphragm can fracture or deform after repeated uses. Another drawback is that conventional diaphragms typically do not exert a large sealing force to close the fluid orifice. Accordingly, such diaphragms may not be suitable for valves that regulate high pressure fluids.

SUMMARY

The present invention is directed toward actuators and methods for forming and using actuators. An actuator assembly in accordance with one aspect of the invention includes an actuator body having an actuator channel with a first end and a second end spaced apart from the first end. An actuator is disposed in the actuator channel and is movable when in a flowable state from a first position in the actuator channel to a second position in the actuator channel. Accordingly, the assembly can further include a heater positioned proximate to the actuator channel to heat the actuator from a solid state to a flowable state. In a further aspect of the invention, the actuator body can include a fluid passageway having an orifice in fluid communication with the actuator channel. Accordingly, the actuator can allow fluid to flow through the orifice when the actuator is in the first position and block the flow of fluid through the orifice when in the second position.

The invention is also directed toward a method for manufacturing an actuator. In one aspect of the invention, the method can include forming a channel in a substrate, positioning an actuator in the channel with the actuator being movable within the channel between a first position and a second position when the actuator is in a flowable state, and disposing an actuator heater adjacent to the channel with the actuator heater configured to at least partially liquify the actuator. The method can further include forming the channel to have a first region and at least one second region adjacent to the first region. The first region can have a first surface characteristic, and the second region can have a second surface characteristic different than the first surface characteristic. The actuator can have a first surface tension when in a flowable state and contacting the first region, and the actuator can have a second surface tension when in a flowable state and contacting the second region. The second surface tension can be greater than the first surface tension such that the actuator can halt its movement through the channel upon contacting the second region.

The invention is also directed toward a method for controlling an actuator. The method can include heating the actuator in an actuator channel from a solid state to a flowable state, moving the actuator in a first region of the actuator channel from a first position to a second position, and cooling the actuator to solidify the actuator in a second position. The method can further include halting the motion of the flowable actuator at the second position by engaging the actuator with a surface of a second region of the channel. For example, the actuator can have a surface tension when in contact with the second region that is higher than a surface tension of the actuator when in contact with the first region such that the actuator can halt its movement in the channel upon contacting the second region.

DETAILED DESCRIPTION

The present disclosure describes actuators, such as valve actuators, and methods for making and using such actuators. Many specific details of certain embodiments of the invention are set forth in the following description and in FIGS. 1–5 to provide a thorough understanding of these embodiments. One skilled in the art, however, will understand that the present invention may have additional embodiments, or that the invention may be practiced without several of the details described below.

Figure 1:
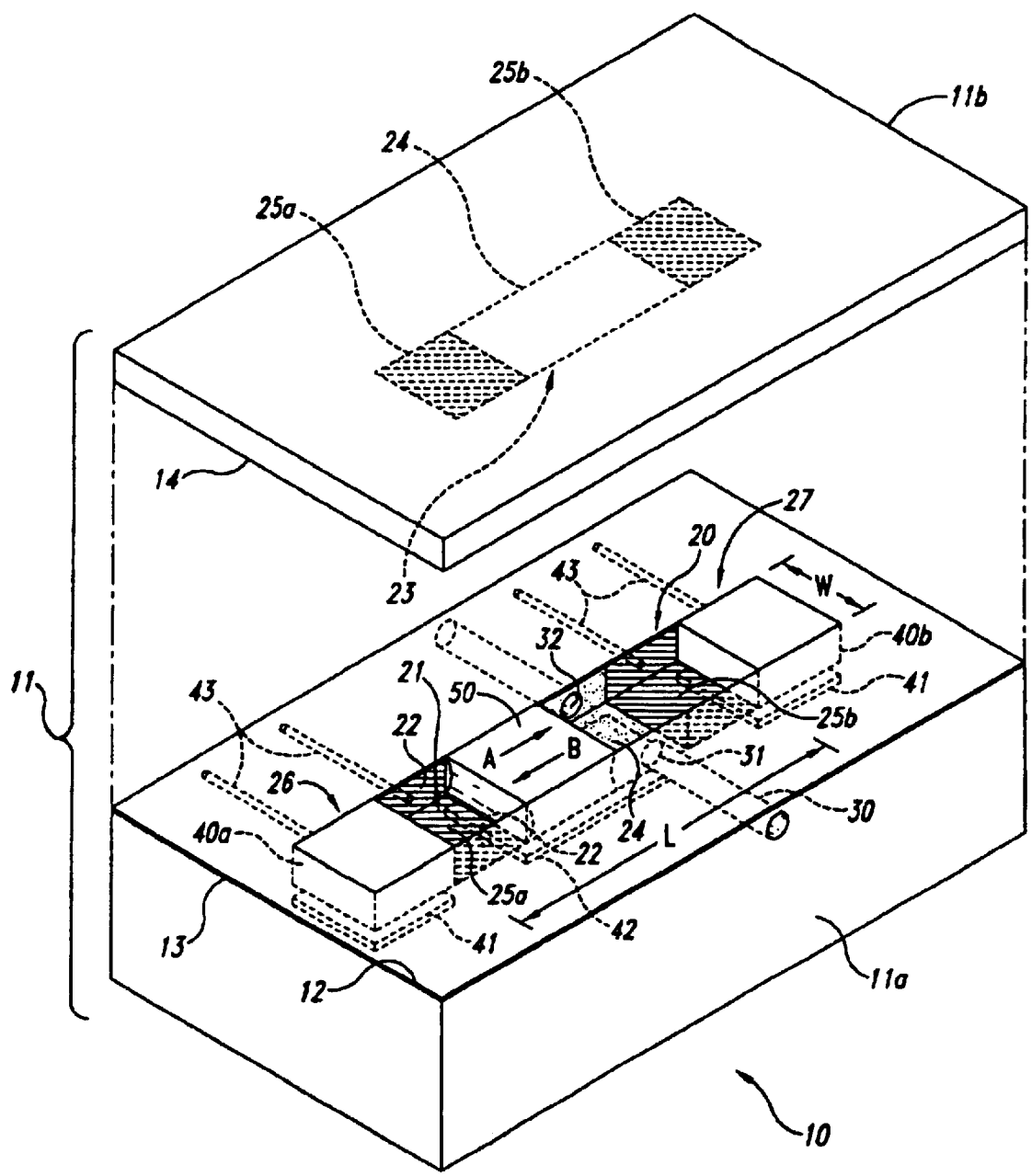
FIG. 1 is a partially exploded top isometric view of an actuator assembly in accordance with an embodiment of the invention.

FIG. 1 is a partially exploded top isometric view of an actuator assembly 10 formed in accordance with an embodiment of the invention. In one aspect of this embodiment, the assembly 10 is configured to regulate a flow of fluid (liquid, gas or another flowable substance) through a fluid passageway 30. Accordingly, the assembly 10 can include a body 11 having a first portion 11a that houses the fluid passageway 30 and a second portion 11b attached to the first portion 11a. The first portion 11a can include an actuator or piston 50 that slides within an actuator channel or piston channel 20 to either open or close a segment of the fluid passageway 30.

In one embodiment, the body 11 can be formed from a semiconductor material, such as silicon. Accordingly, the features formed in the body 11 can be formed using techniques generally similar to those conventionally used for forming integrated circuits in semiconductor substrates, as described in greater detail below. In other embodiments, the body 11 can be formed from non-semiconductor materials and/or with other techniques. In either embodiment, many of the features of the body 11 can be formed separately in the first portion 11a and the second portion 11b. The portions 11a, 11b can subsequently be joined by attaching an upper surface 12 of the first portion 11a to a lower surface 14 of the second portion 11b. Accordingly, the first portion 11a can include a bonding layer 13 to promote adhesion between the first portion 11a and the second portion 11b. Alternatively, the second portion 11b can include a bonding layer in addition to or in lieu of the bonding layer on the first portion 11a, or the bonding layer 13 can be eliminated.

In one embodiment, the channel 20 in the body 11 can include a bottom surface 21 and opposing side surfaces 22 in the first portion 11a, and a top surface 23 in the second portion 11b. Accordingly, the channel 20 can be completely enclosed when the second portion 11b is joined to the first portion 11a. In one aspect of this embodiment, the side surfaces 22 can be perpendicular to the bottom surface 21. Alternatively, the side surfaces 22 can be canted relative to the bottom surface 21. In either embodiment, the channel 20 can have a first unwetted region 25a (shown by left cross-hatching) toward a first end 26 of the channel 20, a second unwetted region 25b (shown by right cross-hatching) toward a second end 27 of the channel 20, and a wetted region 24 between the first and second unwetted regions 25a, 25b. The fluid passageway 30 intersects the channel 20 in the wetted region 24. Accordingly, the fluid passageway 30 can have an entrance orifice 31 in one side surface 22 of the channel 20 and an exit orifice 32 in the opposite side surface 22.

The actuator 50 is positioned in the wetted region 24 proximate to the entrance orifice 31 and the exit orifice 32. When the actuator 50 is in a liquid state (or another flowable state), it can wet and seal against the bottom surface 21, the side surfaces 22 and the top surface 23 of the channel 20. The actuator 50 can also move back and forth along the wetted region 24, as indicated by arrows "A" and "B," when in the flowable state to close and open the entrance orifice 31.

In a further aspect of this embodiment, the actuator 50 will not move into either of the unwetted regions 25a, 25b due to high capillary forces associated with the interface between the actuator 50 and the unwetted regions 25a, 25b. Accordingly, the motion of the actuator 50 can be limited to linear travel between a first position and a second position. In the first or open position (shown in FIG. 1), the actuator 50 is spaced apart from the entrance orifice 31 and the exit orifice 32 of the fluid passageway 30 to allow fluid to pass through the fluid passageway 30 from the entrance orifice 31 across the channel 20 to the exit orifice 32. In the second or closed position, the actuator 50 is positioned between the entrance orifice 31 and the exit orifice 32 to block the flow of fluid through the fluid passageway 30 beyond the entrance orifice 31.

In one aspect of an embodiment of the assembly 10 shown in FIG. 1, the actuator 50 can be moved back and forth within the channel 20 by sequentially introducing a gas toward one of the first end 26 or the second end 27 of the channel 20. For example, the assembly 10 can include two gas sources 40 shown in FIG. 1 as a first gas source 40a toward the first end 26 and a second gas source 40b toward the second end 27. In a further aspect of this embodiment, each gas source 40 can include a metal hydride that releases hydrogen when heated and reabsorbs the hydrogen when cooled. Accordingly, the first gas source 40a can be heated to release hydrogen into the channel 20 toward the first end 26 and drive the actuator 50 toward the closed position, as indicated by arrow A. Alternatively, the second gas source 40b can be heated to release hydrogen toward the second end 27 of the channel 20 and drive the actuator 50 toward the open position, as indicated by arrow B. Additional materials relating to metal hydrides and other gas-containing metals are included in Chapter 8 of "Scientific Foundations of Vacuum Technique," by S. Dushman and J. M. Latterly (1962), and in pending U.S. patent application Ser. Nos. 09/546,084 and 09/258,363, all incorporated herein in their entirety by reference.

In one embodiment, the body 11 can include vent channels 43 coupled to the gas sources 40 and/or the channel 20. The vent channels 43 can provide a safety outlet for hydrogen at the gas source 40 and/or in the channel 20 to vent the hydrogen if the pressure of the hydrogen exceeds a preselected value. The vent channels 43 can also dampen pressure pulses produced by the gas sources 40 by receiving some of the gas released by the gas sources 40. Alternatively, the vent channels 43 can release the hydrogen produced by the gas sources 40 from the assembly 10 during normal operation. Accordingly, the hydrogen is not reabsorbed by the gas sources 40. In a further aspect of this alternate embodiment, the gas sources 40 can be used for a limited number of actuator movements, or the gas sources 40 can be replenished with gas from an external source.

In yet another aspect of an embodiment of the assembly 10 shown in FIG. 1, the body 11 can include one or more heaters for controlling the temperature of the gas sources 40 and/or the actuator 50. For example, the body 11 can include gas source heaters 41 adjacent to and thermally coupled to each of the gas sources 40 to independently heat the gas sources 40 and release the hydrogen (or other gas) from the gas sources 40. The body 11 can further include an actuator heater 42 positioned adjacent to and thermally coupled to the wetted region 24 of the channel 20 to heat and at least partially liquify the actuator 50 prior to moving the actuator 50 within the channel 20. The heaters can be independently controlled to achieve the temperature necessary to release gas from the gas sources 40 and at least partially liquify the actuator 50 at selected phases during the operation of the assembly 10, as will be described in greater detail below. The heaters can be positioned in the first portion 11a of the body 11 (as shown in FIG. 1) or alternatively, the heaters can be positioned in the second portion 11b.

The materials forming channel 20 and the actuator 50 can be selected to enhance the performance of the actuator 50 in the channel 20. For example, the wetted region 24 of the channel 20 can include a coating of a noble metal (such as platinum or gold), or another metal (such a palladium or rhodium) that resists corrosion and/or is easily wetted by the actuator 50 when the actuator 50 is in an at least partially flowable state. The actuator 50 can accordingly include a material that has a relatively low melting point and that readily wets the wetted region 24. Suitable materials for the actuator 50 include lead and lead alloys (such as are found in solders), bismuth, cadmium, selenium, thallium, tin and/ or zinc. In other embodiments, the actuator 50 can include other metals, alloys, inorganic and/or organic materials, so long as the actuator 50 can achieve an at least partially flowable state when heated and/or can be halted by contact with the non-wetted regions 25a, 25b. Conversely, the non-wetted regions 25a, 25b of the channel 20 can be coated with a material that is not easily wetted by the actuator 50. For example, when the actuator 50 includes lead or a lead alloy, the non-wetted regions 25a, 25b can include an oxide or a nitride, such as silicon dioxide, aluminum oxide, or silicon nitride. In any of these embodiments, the materials selected for the body 11, the wetted region 24 and the non-wetted regions 25 have a higher melting point than the material selected for the actuator 50 so that only the actuator 50 will melt when the actuator heater 42 is activated.

In operation, the fluid passageway 30 is coupled to a source of fluid (not shown in FIG. 1). The actuator heater 42 is activated to at least partially melt the actuator 50 and/or otherwise increase the flowability of at least the external surfaces of the actuator 50 while the actuator 50 remains sealably engaged with the surfaces of the channel 20. The first gas source 40a is activated (for example, by activating the adjacent gas source heater 41) to release gas into the channel 20 toward the first end 26 and drive the actuator 50 from its first or open position (shown in FIG. 1) to its second or closed position between the entrance orifice 31 and the exit orifice 32 of the fluid passageway 30. The actuator 50 halts when it reaches the second unwetted region 25b, due to very strong capillary forces at the interface between the actuator 50 and the second unwetted region 25b. The actuator heater 42 is then deactivated to solidify the actuator 50 in its closed position with the actuator 50 sealed against the surfaces 21, 22 and 23 of the channel 20. The gas source heater 41 is then deactivated and the first gas source 41a re-absorbs the released gas.

To open the fluid passageway 30, the actuator 50 is heated as described above is and the second gas source 40b is activated to drive the actuator 50 from the closed position to the open position. The actuator 50 is then allowed to cool to solidify the actuator 50 in the open position and seal the actuator 50 against the surfaces of the channel 20. The second gas source 40b is cooled to allow the gas released into the channel 20 to reabsorb to the second gas sources 40b. In one embodiment, the foregoing steps can be repeated to cycle the actuator 50 back and forth between the open position and the closed position at a frequency of up to at least 1,000 cycles per second. In other embodiments, the actuator 50 can be cycled at other frequencies higher or lower than 1,000 cycles per second.

In one embodiment, the assembly 10 can be formed in silicon or another semiconductor substrate using photolithographic masking and etching techniques to define several features of the assembly 10. For example, when the gas source heaters 41 and the actuator heater 42 include electrical resistance heaters, the heaters 41, 42 can be formed directly in the first portion 11a by first etching cavities to accommodate the heaters and then depositing or otherwise disposing in the cavities a conductive material that achieves the desired temperature when an electrical current is applied to the conductive material. Alternatively, the heaters 41 and 42 can be positioned in the second portion 11b using similar techniques.

The channel 20 can also be formed in the first portion 11a using an etching technique. In one embodiment, the bottom surface 21 and the side surfaces 22 of the channel 20 (including the wetted region 24 and the non-wetted regions 25a and 25b) can then be oxidized. Next, the wetted region 24 can be coated with a metal adhesion layer, such as chromium, followed by a noble metal film, such as platinum, or another wettable metal material. The top surface 23 of the channel 20 (in the second portion 11b) can be processed in a generally similar manner.

Before the second portion 11b is attached to the first portion 11a, the actuator 50 is positioned in the wetted region 24 of the channel 20. In one embodiment, the volume of material forming the actuator 50 is selected to span the channel 20 from one side surface 22 to the other and from the bottom surface 21 to the top surface 23 when the body second portion 11b is attached to the first portion 11a. However, the volume of actuator material does not occupy the entire wetted region 24 to allow for movement of the actuator 50 back and forth between the open and closed positions. When the gas sources 40 include metal hydrides, they can be deposited directly in the ends 26 and 27 of the channel 20. Alternatively, the hydride or other gas source 40 can be preformed and positioned in the channel 20. The second portion 11b of the body 11 can then be attached to the first portion 11a in an inert or a reducing environment to promote adhesion between the two portions.

In one embodiment, the actuator 50 can be disposed in the channel 20 using a conventional etch and photomask process. For example, the material forming the actuator 50 can be deposited directly into the channel 20 (and, in one embodiment, over other parts of the first portion 11a). A layer of photoresist material can be applied to the actuator material and a positive or negative mask can be used to eliminate the photoresist from all regions except a region that defines the outline of the actuator 50. The remaining photoresist shields the portion of the actuator material that defines the actuator 50 and the excess actuator material is etched away using conventional etchants.

Figure 2:
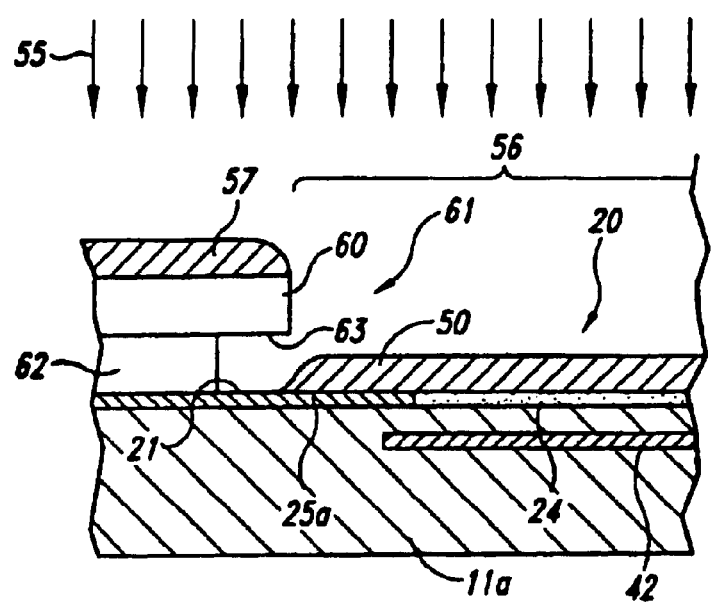
FIG. 2 is a cross-sectional side view illustrating a process for depositing an actuator on a portion of the assembly shown in FIG. 1 in accordance with an embodiment of the invention.

FIG. 2 illustrates an alternate method for disposing the actuator 50 in the channel 20 in accordance with another embodiment of the invention. This method may be suitable where it is difficult to remove the excess actuator material with an etching process. In one aspect of this embodiment, a spacer layer 62 and a resist layer 60 are disposed on the bottom surface 21 of the channel 20 and on other parts of the first portion 11a. An aperture 61 is formed in the resist layer 60 and the spacer layer 62 and is aligned with an actuator deposition region 56 in the channel 20. The spacer layer 62 can be undercut (for example, by etching the spacer layer 62) so that the resist layer 60 has an overhanging portion 63 that faces directly toward the bottom surface 21 of the channel 20. The actuator material 55 is deposited on the first portion 11a to form the actuator 50 in the actuator deposition region 56 and an excess portion 57 of the actuator material 55 on the resist layer 60. The excess portion 57 and the resist layer 60 are then removed by dissolving the spacer layer 62 with an appropriate solvent. The overhanging portion 63 can reduce the likelihood for "bridging" between the actuator 50 and spacer layer 62, and can also provide an access channel for the solvent.

Figure 3A:
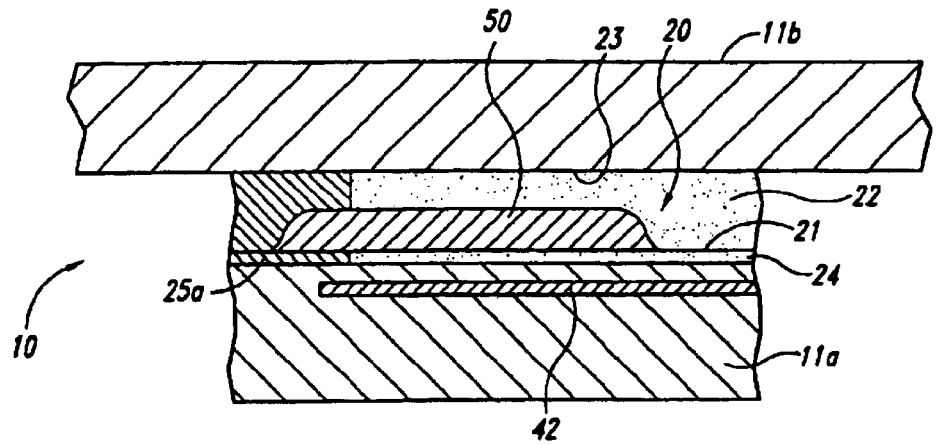
FIGS. 3A–3B are cross-sectional side views illustrating additional processes for forming the actuator shown in FIG. 2 in accordance with an embodiment of the invention.
Figure 3B:
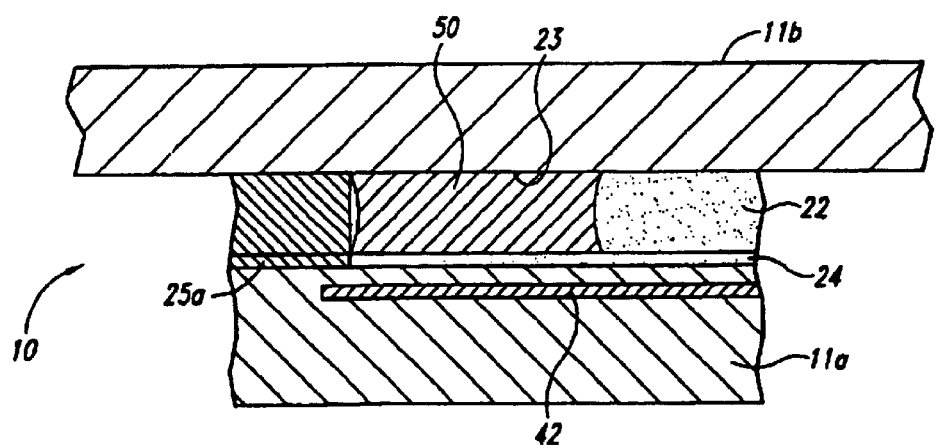

FIG. 3A is a cross-sectional side view of a portion of the assembly 10 described above with reference to FIG. 1 immediately after attaching the second portion 11b to the first portion 11a. In one aspect of this embodiment, the actuator 50 is initially disposed in the actuator channel 20 in a solid state to extend over a portion of the wetted region 24 and the first unwetted region 25a. The actuator 50 projects upwardly from the bottom surface 21 of the channel 20, but does not initially contact the top surface 23. When an electrical current is applied to the actuator heater 42, the actuator 50 liquifies. Because the surface tension between the liquified actuator 50 and the first unwetted region 25a is substantially higher than between the liquified actuator 50 and the wetted region 24, the actuator 50 retracts from the unwetted region 25a to form a meniscus at the interface between the wetted region 24 and the unwetted region 25a, as shown in FIG. 3B. In a further aspect of this embodiment, the liquified actuator 50 wicks upwardly along the side surfaces 22 of the channel 20 to engage the top surface 23. Accordingly, the actuator 50 can fill the entire cross-sectional flow area of the channel 20 (as shown in FIG. 1) after its initial liquifaction. When the actuator 50 cools and solidifies, it can form a sealed interface with the surfaces of the channel 20 to prevent fluid in the fluid passageway 30 (FIG. 1) from escaping past the actuator 50 toward the ends 26, 27 (FIG. 1) of the channel 20. In one embodiment, the actuator 50 can have a length approximately equal to twice its height, and in other embodiments, the actuator 50 can have other dimensions, depending on the dimensions of the channel 20.

In still further embodiments, the actuator 50 can be disposed in the channel 20 in other manners. For example, the actuator 50 can initially be positioned to reside entirely within the wetted region 24, rather than extending into the first unwetted region 25a. The actuator 50 then wicks up the side surfaces 22 to the top surface 23 of the channel upon being heated, as described above. Alternatively, the actuator 50 can be initially disposed in the channel 20 in a liquid form, provided that the environment in which the assembly 10 is formed has a temperature above the melting point of the actuator 50.

One feature of an embodiment of the assembly 10 described above with reference to FIGS. 1–3 is that the channel 20 and the actuator 50 can be made extremely compact by forming these and other elements of the assembly 10 directly in the body 11. Accordingly, the overall dimensions of the assembly 10 can be suitable for many sub-miniature applications. For example, (referring now to FIG. 1) the channel 20 can have a width "W" of from about one micron to about five microns and a length "L" of from about two microns to about 50 microns. In other embodiments, the dimensions of the channel 20 can be smaller, provided that the techniques for forming the channel 20 and other components of the assembly 10 are compatible with the reduced dimensions. Conversely, the channel 20 and the actuator 50 can be larger in still further embodiments provided that (a) the actuator 50 can remain in contact with the surfaces 21, 22, and 23 of the channel 20 when in a liquid state, and (b) the actuator 50 does not develop so much momentum as it moves within the channel 20 that it crosses from the wetted region 24 into either of the unwetted regions 25a, 25b.

Another feature of an embodiment of the assembly 10 described above with reference to FIGS. 1–3 is that the actuator 50 is in a liquid or otherwise flowable state when it is in motion, and can be solidified when at rest. An advantage of this feature is that the actuator 50 can require less force than some conventional actuators to move between positions because of the relatively low friction between the liquid actuator 50 and the surfaces of the channel 20. Another advantage is that the actuator 50 may be less susceptible to accidental actuation (for example, in a high pressure or high acceleration environment) because the actuator 50 will not move unless it is heated. Still another advantage is that the actuator 50 can form a strong, liquid-tight and/or gas-tight bond with the surfaces of the channel 20 (generally similar to the bond between solder and soldered wires) when the actuator 50 is in the solid state. Accordingly, the actuator 50 can withstand high pressures when in the solid state.

Still another advantage of an embodiment of the actuator 50 is that the surface tension and the volume free energy of the actuator act to minimize the length of the actuator 50 and preserve the integrity of the actuator when the actuator is in a liquid state. Accordingly, the actuator 50 can withstand relatively high pressures (such as the pressure of the fluid acting or the actuator 50 through the entrance orifice 31) without becoming fragmented, even when the actuator is in a liquified or partially liquified state.

Yet another feature of an embodiment of the assembly 10 is that the actuator 50 can perform functions other than the valve functions described above with reference to FIGS. 1–3. For example, in one embodiment, the heaters 41 and 42 can be eliminated and the actuator 50 can move when the temperature of its environment increases by an amount sufficient to liquify the actuator 50 and release gas from one of the gas sources 40. Accordingly, the actuator 50 can be coupled to a fire suppression system or other heat-activated device. In other embodiments, the actuator 50 can be operatively coupled to elements other than a fluid channel, such as electrical contacts of a fuse or a relay to transmit linear motion to the other elements. In other embodiments, the actuator 50 can have other functions and/or can be operatively coupled to other devices.

Figure 4:
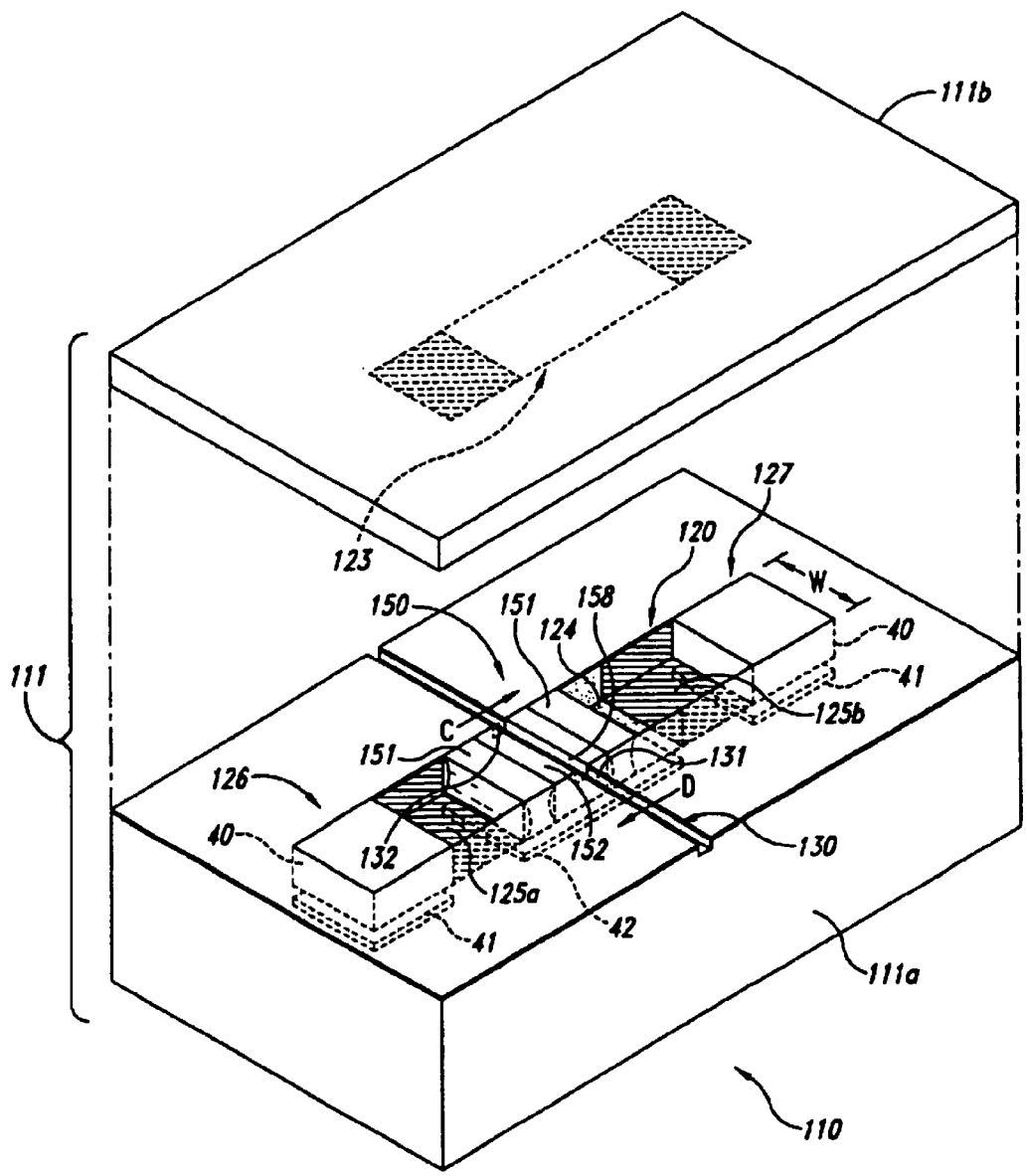
FIG. 4 is a top isometric view of a portion of an assembly having an actuator with a slider portion in accordance with another embodiment of the invention.

FIG. 4 is a top isometric view of a portion of an assembly 110 having an actuator 150 configured in accordance with another embodiment of the invention. In one aspect of this embodiment, the assembly 110 can include a body 111 having a first portion 111a with a channel 120 and a second portion 111b generally similar to the first portion 11a and second portion 11b described above with reference to FIGS. 1–3B. The actuator 150 is disposed in the channel 120 and is movable within the channel (as indicated by arrows "C" and "D") between a first position (shown in FIG. 4) and a second position. In the first position, the actuator 150 allows a fluid to pass through a fluid passageway 130 from an entrance orifice 131 across the channel 120 to an exit orifice 132. In the second position, the actuator 150 blocks the motion of fluid from the entrance orifice 131 to the exit orifice 132, as will be described in greater detail below.

In one embodiment, the actuator 150 includes two flowable portions 151 positioned at opposite ends of a non-flowable slider portion 152. The flowable portions 151 operate in a manner generally similar to that described above with reference to FIGS. 1–3 to liquify and move the actuator 150 over a wetted region 124 of the channel 120 positioned between a first unwetted region 125a and a second unwetted region 125b. Conversely, the slider portion 152 can remain in a solid state throughout the operation of the actuator 150 in one embodiment.

In one aspect of this embodiment, the slider portion 152 includes a groove 158 that extends across the width "W" of the channel 120. The groove 158 is aligned with the entrance orifice 131 and the exit orifice 132 when the actuator 150 is in the open position to allow fluid to pass from the entrance orifice 131 to the exit orifice 132. The groove 158 is offset from the entrance orifice 131 and the exit orifice 132 when the actuator 150 is in the closed position to prevent the fluid from passing from the entrance orifice 131 to the exit orifice 132. As the slider portion 152 moves back and forth between the open and closed positions, the flowable portions 151 of the actuator 150 can seal against the surfaces of the channel 120 and the slider portion 152 to prevent the fluid from escaping past the actuator 150 toward opposite ends 126 and 127 of the channel 120.

In one embodiment, the slider portion 152 can be formed from a hydrogenated amorphous silicon carbide. In one aspect of this embodiment, the slider portion 152 can be formed by depositing in the channel 120 an $Si_xC_y$:H compound by plasma enhanced chemical vapor deposition (PECVD). The adhesive forces between the resulting slider portion 152 and the surfaces of the channel 120 can be reduced in one embodiment by lowering the temperature at which the PECVD process occurs and/or by adding $CF_4$ to the plasma to form a $Si_xC_yF_z$:H film. The resulting carbide slider portion 152 can be mechanically polished to produce a flat surface for mating with a top surface 123 of the channel 120 defined by the second portion of the body 111. The groove 158 can be formed in the slider portion 152 by a reactive ion etching process, which can also be used to remove any extraneous carbide in the channel 120. In other embodiments, the slider portion 152 can be formed from other materials and/or by other processes.

One feature of an embodiment of the assembly 110 described above with reference to FIG. 4 is that the slider portions 152 can isolate the fluid passing through the passage 130 from contact with the flowable portions 151. An advantage of this feature is that the assembly 110 can be used to control the flow of fluids that are not compatible with the materials forming the flowable portions 151 of the actuator 150. Another advantage of this feature is that the slider portion 152 can isolate the fluid in the passageway 130 from contact with the wetted region 124 of the channel 120. Accordingly, the assembly 110 can reduce the likelihood for oxidizing or otherwise contaminating the wetted region 124.

Figure 5:
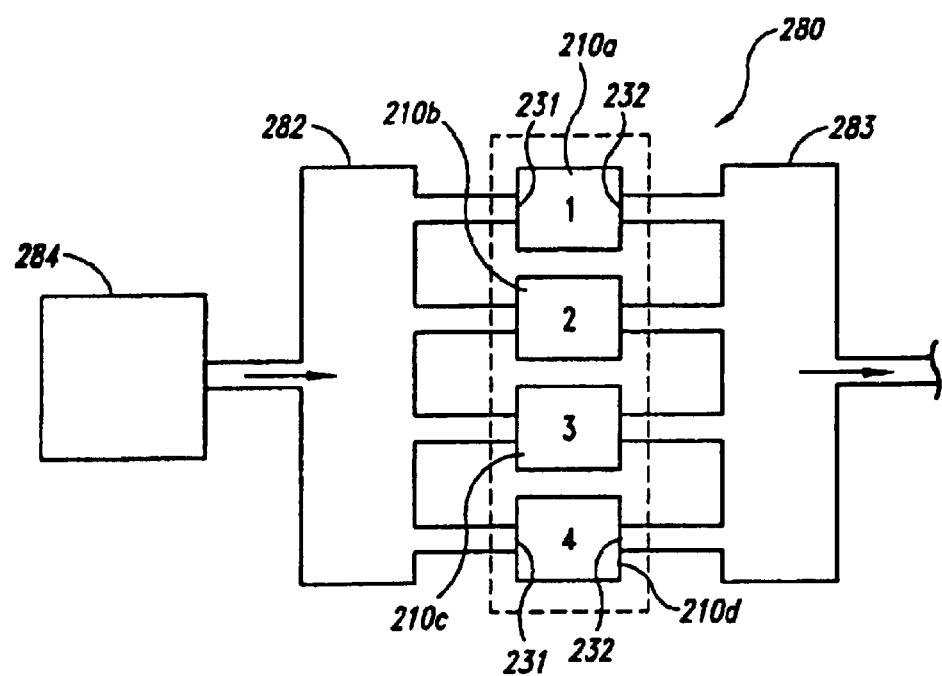
FIG. 5 is a partially schematic view of a valve assembly in accordance with yet another embodiment of the invention.

FIG. 5 is a schematic illustration of a valve assembly 280 configured to incrementally vary a flow of fluid in accordance with another embodiment of the invention. In one aspect of this embodiment, the valve assembly 280 can include four multiplexed valves 210 (shown as valves 210a–210d), each configured in a manner generally similar to the assembly 10 or the assembly 110 described above with reference to FIGS. 1–4. Accordingly, each valve 210 has a entrance orifice 231, an exit orifice 232, and an actuator (not shown in FIG. 5) that can move back and forth between the entrance orifice 231 and the exit orifice 232 to open and close fluid communication between each pair of entrance and exit orifices. In a further aspect of this embodiment, each valve 210 can have a separate gas source for driving each valve actuator. Alternatively, a pair of gas sources (one for each direction of travel of the actuators) can be coupled to all the valves 210a–210d, with only selected valve actuators moving, depending on which actuator heaters are activated.

In a further aspect of this embodiment, each entrance orifice 231 can be coupled to an entrance manifold 282 which is in turn coupled to a source 284 of fluid. Each exit orifice 232 can be coupled to an exit manifold 283 which can in turn be coupled to downstream devices (not shown). Alternatively, the valves 210a–210d can be coupled to different sources 284, for example, to mix fluids from the different sources.

In still another aspect of this embodiment, each valve 210 can have a different flow capacity. For example, the first valve 210a can have a flow capacity of one flow rate unit, the second valve 210b can have a flow capacity of two flow rate units, the third valve 210c can have a flow capacity of three flow rate units, and the fourth valve 210d can have a capacity of four flow rate units. By selectively opening one or more of the valves 210a–210d, the valve assembly 280 can allow a fluid flow having any integer value of from zero flow rate units to 10 flow rate units to pass from the entrance manifold 282 to the exit manifold 283. Accordingly, while each individual valve 210 does not incrementally adjust the flow of fluid from the entrance manifold 282 to the exit manifold 283, the combination of valves 210 can provide such an incremental adjustment. In other embodiments, other combinations of valves and valve capacities can be used to provide more or fewer incremental flow rates. In one embodiment, the valves 210a–210d can be formed in a single substrate (such as a semiconductor substrate) or alternatively, one or more of the valves 210a–210d can be formed in a separate substrate.

From the foregoing, it will be appreciated that specific embodiments of the invention have been described herein for purposes of illustration, but that various modifications may be made without deviating from the spirit and scope of the invention. Accordingly, the invention is not limited expect as by the appended claims.

What is claimed is:

1. A method for manufacturing a flow valve, comprising:
   forming a channel having channel surfaces in a first silicon substrate;
   disposing a first coating on a first region of the channel surfaces;
   disposing a second coating on two second regions of the channel surfaces adjacent to opposite ends of the first region;
   positioning a piston in the channel, the piston having a first surface tension when in a liquid state and contacting the first coating, the piston having a second surface tension when in a liquid state and contacting the second coating, with the second surface tension greater than the first surface tension;
   forming a fluid flow channel in the first silicon substrate, the flow channel having an orifice in fluid communication with the channel;
   sealing the piston in the channel by attaching to the first silicon substrate a second silicon substrate having a surface facing toward the piston;
   forming a piston heating element in at least one of the first and second silicon substrates to heat the piston to a liquid state; and
   coupling a first hydrogen source to one end of the channel and coupling a second hydrogen source to an opposite end of the channel.

2. The method of claim 1 wherein positioning a piston in the channel includes depositing in the channel by chemical vapor deposition a material forming the piston.

3. The method of claim 1 wherein positioning a piston in the channel including depositing a non-flowable material in the channel, disposing a first volume of a flowable material in the channel adjacent to one end of the non-flowable material, and disposing a second volume of the flowable material in the channel adjacent to an opposite end of the non-flowable material, the non-flowable material remaining in a solid state when the piston heating element is activated, the flowable material at least partially liquifying when the piston heating element is activated.

4. The method of claim 1 wherein forming a channel includes forming a depression in the first silicon substrate, the depression having a length aligned with a direction of travel of the piston of from about two microns to about fifty microns or less, the depression having a width transverse to the length of from about one micron to about five microns or less.

5. The method of claim 1 wherein positioning a piston in the channel includes depositing a non-flowable slider portion in the channel having a first end, a second end opposite the first end, and a groove between the first and second ends, the groove being aligned with the orifice when the piston is in a first position and offset from the orifice when the piston is in a second position.

6. The method of claim 1 wherein disposing a first coating on a first region of the channel surfaces includes disposing a noble metal on the first region, and wherein disposing a second coating on two second regions of the channel surfaces includes disposing an oxide on the second regions.

7. The method of claim 1 wherein disposing a first coating on a first region of the channel surfaces includes disposing a noble metal on the first region, wherein disposing a second coating on two second regions of the channel surfaces includes disposing an oxide on the second regions, and wherein positioning a piston in the channel includes depositing a solder material in the channel, the solder material having a first surface tension when the solder material is in a flowable state and adjacent to the first region of the channel surface, the solder material having a second surface tension greater than the first surface tension when the solder material is in a flowable state and adjacent to the second region of the channel.

8. The method of claim 1 wherein positioning a piston in the channel includes depositing a solder material in the channel.

9. The method of claim 1 wherein forming a piston heating element includes forming a resistive heater adjacent to the channel and configured to at least partially liquify the piston.

10. The method of claim 1 wherein forming the channel includes forming a first channel, wherein positioning a piston includes positioning a first piston in the first channel, wherein forming the fluid flow channel includes forming a first fluid flow channel having a first orifice, the first orifice being coupled to a first fluid passageway, and wherein the method further comprises forming a second channel in the first silicon substrate, positioning a second piston in the second channel, and forming a second fluid flow channel in the first silicon substrate, the second flow channel having a second orifice in fluid communication with the second channel, the second orifice being coupled to a second fluid passageway arranged in parallel with the first fluid passageway to control a flow of fluid through the passageways.

11. The method of claim 1, further comprising coupling a vent to the piston channel to vent gas directed into the channel against the piston.

12. The method of claim 1 wherein forming a channel includes forming a channel from a channel material, wherein forming a piston includes forming a piston from a piston material, and wherein the channel material has a first melting point that is higher than a second melting point of the piston material.

13. The method of claim 1, further comprising coupling a source of fluid to the fluid flow channel to control a flow of fluid from the source when the piston moves from a first position to a second position in the channel.

14. The method of claim 1 wherein positioning a piston includes positioning a slider member including a hydrogenated amorphous silicon carbide.

15. The method of claim 1 wherein positioning a piston includes disposing a piston in the channel that is movable when in a flowable state from a first position in the channel to a second position in the channel.

16. The method of claim 1 wherein positioning a piston includes disposing a reciprocating piston in the channel that is movable back and forth when in a flowable state from a first position in the channel to a second position in the channel.

17. The method of claim 1 wherein positioning a piston includes depositing at least one of lead, tin, bismuth, cadmium, selenium, thallium and zinc in the channel.

18. The method of claim 1 wherein disposing a first coating includes disposing at least one of platinum, rhodium, palladium and gold, and wherein disposing a second coating includes disposing at least one of an oxide and a nitride.

19. A method for manufacturing a flow valve, comprising:

forming a channel having channel surfaces in a first silicon substrate;

disposing a first coating on a first region of the channel surfaces;

disposing a second coating on two second regions of the channel surfaces adjacent to opposite ends of the first region;

positioning a piston in the channel;

forming a fluid flow channel in the first silicon substrate, the flow channel having an orifice in fluid communication with the channel;

sealing the piston in the channel by attaching to the first silicon substrate a second silicon substrate having a surface facing toward the piston;

forming a piston heating element in at least one of the first and second silicon substrates to heat the piston to a liquid state; and coupling a first gas source to one end of the channel and coupling a second gas source to an opposite end of the channel.

20. The method of claim 19 wherein positioning a piston includes positioning a piston having a first surface tension when contacting the first coating and a second surface tension when contacting the second coating, with the second surface tension greater than the first surface tension.

21. The method of claim 19 wherein positioning a piston in the channel includes depositing a non-flowable material in the channel, disposing a first volume of a flowable material in the channel adjacent to one end of the non-flowable material, and disposing a second volume of the flowable material in the channel adjacent to an opposite end of the non-flowable material, the non-flowable material remaining in a solid state when the piston heating element is activated, the flowable material at least partially liquifying when the piston heating element is activated.

* * * * *

UNITED STATES PATENT AND TRADEMARK OFFICE
CERTIFICATE OF CORRECTION

PATENT NO. : 6,834,663 B2
DATED : December 28, 2004
INVENTOR(S) : Jerome M. Eldridge It is certified that error appears in the above-identified patent and that said Letters Patent is hereby corrected as shown below:

Title page,
Item [56], References Cited, U.S. PATENT DOCUMENTS, insert:

| | | | |
|---|---|---|---|
| -- 4,377,209 | | Golben | 03/22/1983 |
| 5,731,797 | | Akiyama et al. | 03/24/1998 |
| 5,738,658 | | Maus et al. | 04/14/1998 |
| 5,810,325 | | Carr | 09/22/1998 |
| 5,871,342 | | Harte et al. | 02/16/1999 |
| 5,959,338 | | Youngner et al. | 09/28/1999 |
| 5,997,527 | | Gumucio et al. | 12/07/1999 |
| 6,023,121 | | Dhuler et al. | 02/08/2000 |
| 6,102,897 | | Lang | 08/15/2000 |
| 6,288,437 | B1 | Forbes et al. | 09/11/2001 |
| 2002/0034581 | A1 | Farrar et al. | 03/21/2002 |
| 6,435,396 | B1 | Eldridge | 08/20/2002 |
| 6,561,479 | B1 | Eldridge | 05/13/2003 |
| 2003/0089865 | A1 | Eldridge | 05/15/2003 |
| 10/738,827 | | Eldridge | Filed 12/16/2003 |
| 6,672,325 | B2 | Eldridge | 01/06/2004 |
| 6,367,251 | B1 | Wood | 04/09/2002 --. |

FOREIGN PATENT DOCUMENTS, insert:
-- DE 19749011    A1    Lang    05/20/1998 --.
OTHER PUBLICATIONS, insert:
-- Case Western Reserve University, R. Quinn, Biologically Inspired Robotics Laboratory, 2 pages, http://biorobots.cwru.edu/>, 06/06/2002; "Micro-Cricket Series Robots," 2 pages, <http://biorobots.cwru.edu/projects/c_mrobot/c_mrobot.htm>, 06/06/2002; Bio-Robotics Lab Publications, 4 pages, <http://biorobots.cwru.edu/publications/publicat.htm>, 06/06/2002.
E.A. AVALLONE and T. BAUMEISTER III, "Marks' Standard Handbook for Mechanical Engineers," 10$^{th}$ Ed., Section 3.3 "Mechanics of Fluids by J.W. Murdock," McGraw Hill, 1996, pp.3-29 – 3-61.
V.J. MINKIEWICZ, J. STASIAK, J.O. MOORE, R. EATON and J.M. ELDRIDGE, "Some Properties of a-$Si_xC_{1-x}$:H Films Prepared by a Mixed Frequency PECVD Process," 1992 Materials Research Society Symposium Proceedings, San Francisco, California, Vol. 268, pp. 133-138.
S. DUSHMAN AND J.M. LAFFERTY, Revised by David G. Worden, "Flow of Gases Through Tubes and Orifices," Scientific Foundations of Vacuum Technique, John Wiley & Sons, Inc., New York, Second Edition, Chapter 2, 1962, pp. 80-117.
S. DUSHMAN AND J.M. LAFFERTY, Revised by Francis J. Norton, "Gases and Metals," Scientific Foundations of Vacuum Technique, John Wiley & Sons, New York, Second Edition, Chapter 8, 1962, pp. 516-559.

UNITED STATES PATENT AND TRADEMARK OFFICE
CERTIFICATE OF CORRECTION

PATENT NO. : 6,834,663 B2
DATED : December 28, 2004
INVENTOR(S) : Jerome M. Eldridge It is certified that error appears in the above-identified patent and that said Letters Patent is hereby corrected as shown below:

OTHER PUBLICATIONS (cont'd),
Fraunhofer ISE, Public Relations, Fuel Cell Supplies Electricity for Laptop, "Banded-Structure Membrane Fuel Cell and Hydrogen Storage in a Hydride," <http://www.ise.fhg.de/Products/brennstoffzelle.html>, 06/06/2002, 3 pages.
JMC (USA), Inc., Hydrogen Storage Alloy Applications, "Hydrogen Storage Alloys for Nickel-Metal Hydride Batteries," <http://www.jmcusa.com/mh2.html>, 06/06/2002, 4 pages. --.

Signed and Sealed this

Seventh Day of February, 2006

JON W. DUDAS
*Director of the United States Patent and Trademark Office*